United States Patent
Kang

(10) Patent No.: US 8,236,134 B2
(45) Date of Patent: Aug. 7, 2012

(54) GAS DISTRIBUTOR AND APPARATUS USING THE SAME

(75) Inventor: Ho-Chul Kang, Seoul (KR)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 1236 days.

(21) Appl. No.: 11/177,883

(22) Filed: Jul. 8, 2005

(65) Prior Publication Data

US 2006/0005926 A1    Jan. 12, 2006

(30) Foreign Application Priority Data

Jul. 9, 2004   (KR) .................. 10-2004-0053641

(51) Int. Cl.
*C23C 16/455*   (2006.01)
*H01L 21/3065*   (2006.01)

(52) U.S. Cl. .................. 156/345.34; 118/715

(58) Field of Classification Search .............. 118/715, 118/723 I; 156/345.34
See application file for complete search history.

(56) References Cited

U.S. PATENT DOCUMENTS

| 5,882,411 A * | 3/1999 | Zhao et al. .................. 118/715 |
| 6,364,949 B1 | 4/2002 | Or et al. |
| 2003/0172872 A1 * | 9/2003 | Thakur et al. ............... 118/715 |

FOREIGN PATENT DOCUMENTS

| CN | 1437220 A | 8/2003 |
| CN | 1574229 | 2/2005 |
| JP | 09-153481 | 6/1997 |
| KR | 10-2001-0003198 | 1/2001 |
| KR | 1020020006295 A | 8/2003 |
| KR | 1020040015931 A | 2/2004 |

OTHER PUBLICATIONS

English Language Abstract of Korean Publication No. 10-2001-0003198, filed on Jan. 19, 2001.

* cited by examiner

*Primary Examiner* — Jeffrie R Lund
(74) *Attorney, Agent, or Firm* — Hosoon Lee

(57) ABSTRACT

A gas distributor for a plasma apparatus includes: a body having a plurality of injection holes, the body being divided into a lower portion and an upper portion with respect to a center surface; and a body supporting unit connected to the lower portion.

14 Claims, 4 Drawing Sheets

GAS DISTRIBUTOR AND APPARATUS USING THE SAME

The present invention claims the benefit of Korean Patent Application No. 2004-0053641 filed in Korea on Jul. 9, 2004, the contents of which are incorporated herein by this reference in their entirety.

BACKGROUND OF THE INVENTION

1. Field of the Invention

The present invention relates to an apparatus using a plasma, and more particularly, to a gas distributor for the apparatus having a supporting means.

2. Description of the Related Art

Flat panel display (FPD) devices having portability and low power consumption have been a subject of increasing research in the present information age. Among the various types of FPD devices, liquid crystal display (LCD) devices are commonly used in notebook and desktop computers because of their high resolution, capability of displaying colored images, and high quality image display.

In general, a semiconductor device or an LCD device is fabricated by repetition of a deposition step of forming a thin film on a wafer or a glass substrate, a photolithographic step of exposing some portions of the thin film using a photosensitive material, a patterning step of removing the exposed thin film and a cleaning step of eliminating a residual material. Each step of the fabrication process is performed in an apparatus under an optimum condition for each step.

FIG. 1 is a schematic cross-sectional view showing a plasma apparatus for a semiconductor device or an LCD device according to the related art. In FIG. 1, the plasma apparatus 100 includes a chamber 110 defining a reaction space, a susceptor 120 having a substrate "S" thereon and a gas distributor 140 over the susceptor 120. The gas distributor 140, which may be referred to as a shower head, includes a plurality of injection holes 142. A backing plate 150 is disposed over the gas distributor 140 and functions as a radio frequency (RF) electrode. Edge portions of the gas distributor 140 are fixed to the backing plate 150 to define a buffer space 180. The buffer space is utilized for a uniform injection of reaction gases such that the reaction gases are supplied to the buffer space 180 through a gas injection pipe 170 from an exterior gas tank (not shown) and then are primarily diffused in the buffer space.

The gas injection pipe 170 may be connected to an RF power supply 160 because the gas injection pipe 170 generally penetrates through a center of the backing plate 150. When the RF power supply 160 is connected to the gas injection pipe 170, an RF power is applied to the center of the backing plate 150 and a symmetric plasma is obtained. The susceptor 120 is movable up-and-down by a driving means (not shown) and includes a heater (not shown) therein for heating the substrate "S." The susceptor 120 may be grounded and functions as an opposite electrode to the gas distributor 140 where the RF power is applied through the backing plate 150 from the RF power supply 160. An exhaust 130 for removing residual gases is formed through a bottom of the chamber 110 and is connected to a vacuum pump such as a turbo molecular pump.

A fabrication process in the plasma apparatus 100 is illustrated hereinafter. A robot arm (not shown) having the substrate "S" moves into the chamber 110 through a slot valve (not shown) and then the substrate "S" is loaded on the susceptor 120. Next, the robot arm moves out of the chamber 110 and the slot valve is closed. Next, the susceptor 120 moves up such that the substrate "S" is disposed in a reaction region. Next, the reaction gases injected through the gas injection pipe 170 and primarily diffused in the buffer space 180 is sprayed through the plurality of injection holes 142 of the gas distributor 140 onto the reaction region over the substrate "S." When the RF power of the RF power supply 160 is applied to the backing plate 150, the reaction gases in the reaction region between the gas distributor 140 and the susceptor 120 are dissociated and excited to form plasma radicals having a strong oxidizing power. The plasma radicals contact the substrate "S" to form a thin film or etch a thin film. An additional RF power may be applied to the susceptor 120 to control an incident energy of the plasma radicals. Next, the susceptor 120 moves down and the robot arm moves into the chamber 110 through the slot valve. The fabrication process is completed by transferring the substrate "S" on the robot arm from the chamber 110.

The gas distributor 140 has a rectangular shape and is made of aluminum. The plurality of injection holes 142 may have a conic shape to diffuse the reaction gases. An upper portion of the conic shape has a diameter smaller than a lower portion of the conic shape. A fixing terminal 146 is formed at a periphery of the gas distributor 140. The fixing terminal 146 is fixed to a bottom surface of the backing plate 150 using a screw 192. For more stable fixation, a clamping bar 190 may be interposed between the fixing terminal 146 and the screw 192. In addition, an edge portion of the gas distributor 140 and the clamping bar 190 may be supported by a supporting means 194 extending from a sidewall of the chamber 110. The supporting means 194 includes an insulating material to prevent a leakage of the RF power.

FIG. 2 is a schematic cross-sectional view of a gas distributor 140 for a plasma apparatus according to the related art. In FIG. 2, the gas distributor 140 includes a body 144 having a rectangular plate shape and a fixing terminal 146 laterally extending from a side of the body 144. The body 144 includes a plurality of injection holes 142. The fixing terminal 146 includes a first horizontal portion 146a, a vertical portion 146b and a second horizontal portion 146c. The fixing terminal 146 has a thin plate shape extending from sidewall of the body 144 and bent twice in a three-dimensional view.

The gas distributor 140 of FIG. 2 may sag at a central portion due to a mass thereof and a thermal transformation. FIG. 3 is a schematic cross-sectional view showing a bending momentum of a gas distributor for a plasma apparatus according to the related art. In FIG. 3, a gas distributor 140 has a downward bending momentum at a central portion of a body 144 because of a thermal transformation. The thermal transformation is caused by a thermal expansion due to a high temperature plasma and/or a heat radiated from a heater in a susceptor 120 (of FIG. 1). Even though the body 140 may expand vertically, the thermal transformation of the body 140 is mainly generated by the horizontal thermal expansion. Since a high temperature plasma and a heater are disposed under the gas distributor 140, a lower portion of the body 144 horizontally expands greater than an upper portion with respect to a mass center surface of the body 144. Accordingly, a downward bending momentum (toward the susceptor 120) is generated at a central portion of the body 144. In addition, the body may be downwardly warped by the gravitation. Therefore, the gas distributor 140 may sag at a central portion due to the downward bending momentum. As a result, a distance between the gas distributor 140 and the susceptor 120 at a central portion of the body 144 is greater than that at a periphery of the body 144. Reaction gases in a reaction space have a non-uniform concentration, thereby deteriorating a process uniformity.

FIG. 4 is a schematic cross-sectional view of another gas distributor according to the related art. In FIG. 4, a gas distributor 140 has a flexible fixing terminal 146 to release a bending momentum. When the body 140 horizontally expands, the vertical portion 146b of the fixing terminal 146 is outwardly pushed and partially receives the horizontal thermal expansion. Accordingly, the downward bending momentum due to the mass of the body 144 and the thermal expansion is relieved. However, the flexible fixing terminal 146 only partially relieves the downward bending momentum and can not remove a sag of the body 144. Since the fixing terminal 146 extends from an upper portion of the body 144 with respect to a mass center surface, an expansion in a lower portion of the body 144 is not restrained and the gas distributor 140 has a sag.

SUMMARY OF THE INVENTION

Accordingly, the present invention is directed to a gas distributor and a plasma apparatus using the gas distributor that substantially obviates one or more of the problems due to limitations and disadvantages of the related art.

An object of the present invention is to provide a gas distributor that prevents a sag of a body by a rigid fixing terminal extending from a lower portion of the body and a plasma apparatus using the gas distributor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a gas distributor for a plasma apparatus includes: a body having a plurality of injection holes, the body being divided into a lower portion and an upper portion with respect to a center surface; and a body supporting unit connected to the lower portion.

In another aspect, a plasma apparatus includes: a process chamber treating a substrate; a susceptor having the substrate thereon; and a gas distributor over the substrate, the gas distributor including: a body having a plurality of injection holes, the body being divided into a lower portion and an upper portion with respect to a center surface; and a body supporting unit connected to the lower portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Since the present invention relates to a plasma apparatus such as a plasma enhanced chemical vapor deposition (PECVD) apparatus and an etcher where process gases are excited to a plasma state in a chamber and contact a substrate, the plasma apparatus may be a fabrication apparatus for a liquid crystal display (LCD) device or a semiconductor device. In addition, the substrate may be a glass substrate for an LCD device or a wafer for a semiconductor device.

Figure 5:
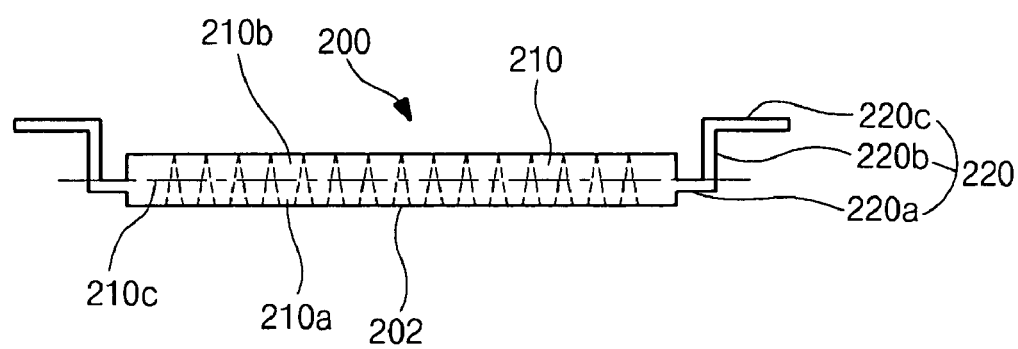
FIG. 5 is a schematic cross-sectional view of a gas distributor for a plasma apparatus according to an embodiment of the present invention.

FIG. 5 is a schematic cross-sectional view of a gas distributor for a plasma apparatus according to an embodiment of the present invention.

In FIG. 5, a gas distributor 200 in a plasma apparatus includes a body 210 having a plurality of injection holes 202 and a body supporting unit 220 of a rigid material. The body 210 and the body supporting unit 220 constitute a monolithic shape. The body 210 may be divided into a lower portion 210a and an upper portion 210b with respect to a mass center surface 210c. The body supporting unit 220 is connected to a sidewall of the body 210 in the lower portion 210a. In addition, the body supporting unit 220 includes a first supporting portion 220a connected to the sidewall of the body 210 in the lower portion 210a, a second supporting portion 220b perpendicular to the first supporting portion 220a and a third supporting portion 220c parallel to the first supporting portion 220a.

When a body has a total mass, a sum of a unit mass times a position vector of a unit element of the body may be obtained and a mass center may be defined as the sum divided by the total mass. The mass center may be a point of a body. In a design drawing, a mass center line may be defined a line connecting vertical mass centers in a cross-sectional drawing. In the present invention, a mass center surface is defined as a surface connecting vertical mass centers of a vertical unit element in a cross-sectional view. Although the mass center surface 210c is shown as a line in FIG. 5, the mass center surface is substantially a surface dividing the body 210 into the lower portion 210a and the upper portion 210b in a three-dimensional view. When the body 210 has a constant density, the mass center surface 210c substantially coincides with a cubic center surface of the body 210 and forms a horizontal surface. When the plurality of injection holes 202 have a conic shape instead of a cylindrical shape, the mass center surface 210c does not exactly coincide with the cubic center surface of the body 210 but forms a surface including a plurality of uneven portions at the plurality of injection holes 202. However, since an influence of the plurality of uneven portions can be neglected, the mass center surface may substantially coincide with the cubic center surface of the body 210.

In addition, the body supporting unit 220 is connected to the lower portion 210a of the body 210. Specifically, the first supporting portion 220a is horizontally connected a sidewall of the lower portion 210a. Accordingly, the supporting unit 220 has a thin plate shape extending from the sidewall in the lower portion 210a of the body 210 and bent twice in a three-dimensional view. The body supporting unit 220 is connected to the lower portion 210a under the mass center surface 210c to relieve a thermal stress due to a horizontal thermal expansion. The gas distributor 200 is disposed in a chamber and a susceptor is disposed under the gas distributor 200. A heater may be disposed in the chamber to keep an optimum temperature during a process.

Figure 6:
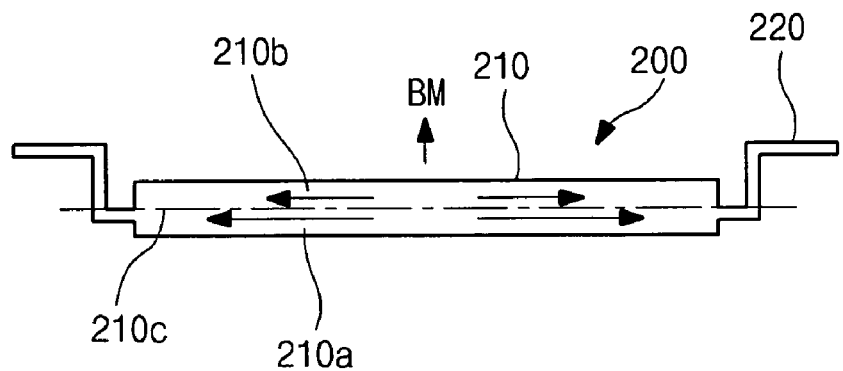
FIG. 6 is a schematic cross-sectional view showing a bending momentum of a gas distributor for a plasma apparatus according to an embodiment of the present invention.

FIG. 6 is a schematic cross-sectional view showing a bending momentum of a gas distributor for a plasma apparatus according to an embodiment of the present invention.

In FIG. 6, a thermal stress of the lower portion 210a of the body 210 is greater than that of the upper portion 210b of the body 210. Since the body supporting unit 220 of a rigid material is connected to the sidewall of the lower portion 210a under the mass center surface 210c, a horizontal expansion of the lower portion 210a due to the thermal stress is restrained by the rigid body supporting unit 220 and the upper portion 210b horizontally expands. Accordingly, an upward bending momentum is generated at a central portion of the body 210. When the body supporting unit 220 has a flexibility, the body supporting unit 220 may absorb the thermal stress. However, since the upward bending momentum decreases, the body supporting unit 220 may include a rigid material to obtain sufficient upward bending momentum. Moreover, angles between the first and second supporting portions 220a and 220b and between the second and third supporting portions 220b and 220c may be kept constant to the sufficient upward bending momentum. The first, second and third supporting portions 220a, 220b and 220c may have the same thickness as one another.

Figure 1:
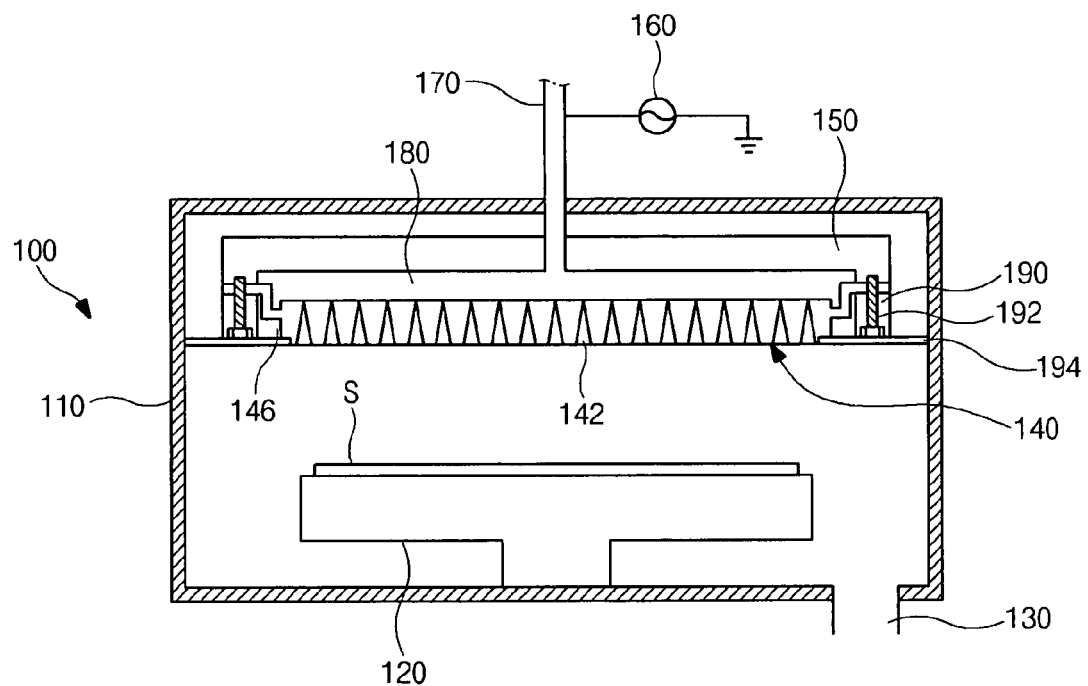
FIG. 1 is a schematic cross-sectional view showing a plasma apparatus for a semiconductor device or an LCD device according to the related art.
Figure 2:
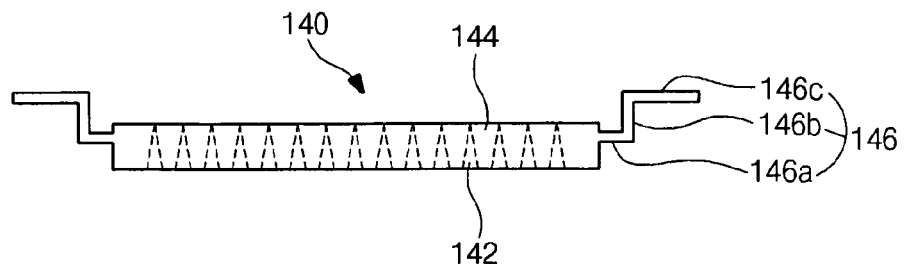
FIG. 2 is a schematic cross-sectional view of a gas distributor 140 for a plasma apparatus according to the related art.
Figure 3:
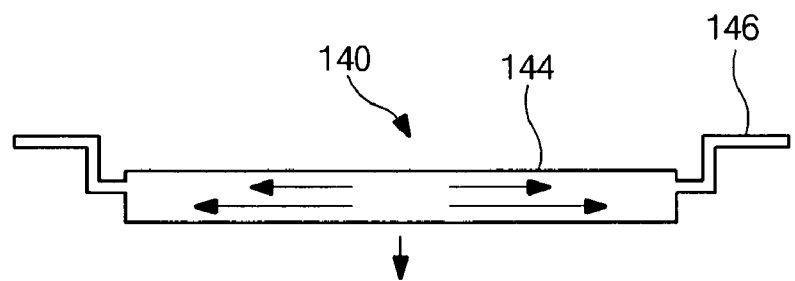
FIG. 3 is a schematic cross-sectional view showing a bending momentum of a gas distributor for a plasma apparatus according to the related art.
Figure 4:
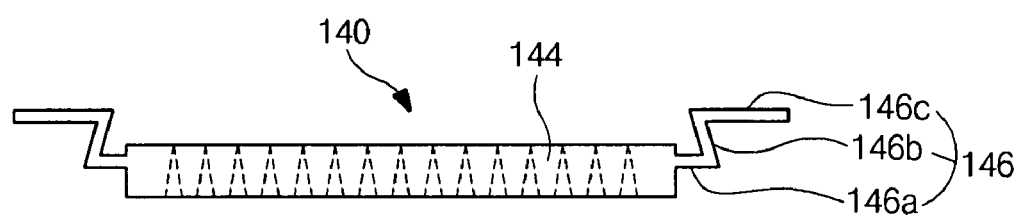
FIG. 4 is a schematic cross-sectional view of another gas distributor according to the related art.

In the related art, the fixing terminal 146 (of FIG. 2) connected to the upper portion of the body 144 (of FIG. 2) absorbs the horizontal thermal expansion of the body 144 (of FIG. 2) due to a transformation and/or a contraction of the fixing terminal 146 and the downward bending momentum is relieved. In the present invention, however, the horizontal thermal expansion of the lower portion 210a of the body 210 is retrained by the rigid body supporting unit 220 and the upward bending momentum is generated.

Figure 7:
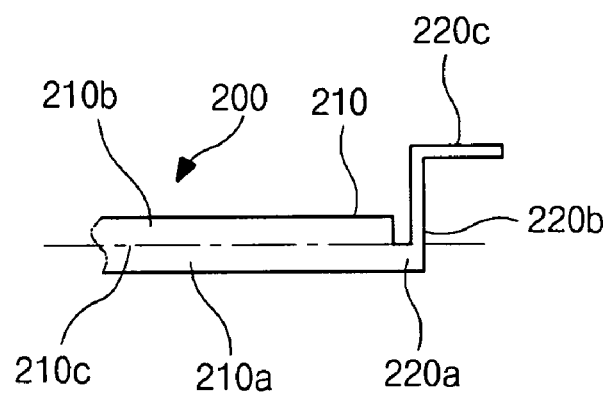
FIGS. 7 and 8 are schematic cross-sectional views showing gas distributors for a plasma apparatus according to another embodiment of the present invention.
Figure 8:
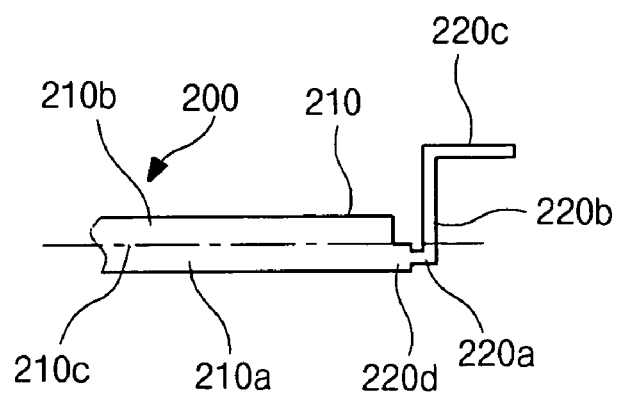

FIGS. 7 and 8 are schematic cross-sectional views showing gas distributors for a plasma apparatus according to another embodiment of the present invention. In FIGS. 7 and 8, a body supporting unit 220 is connected to a lower portion 210a of a body 210 under a mass center surface 210c.

As shown FIG. 7, the first supporting portion 220a has the same thickness as the lower portion 210a of the body 210. In addition, the thickness of the first supporting portion 220a is greater than the thickness of the second supporting portion 220b. Accordingly, the first supporting portion 220a functions as a relieving unit between the body 210 and the second supporting portion 220b for a thermal stress of the body 210.

In FIG. 8, the body supporting unit 220 further includes a fourth supporting portion 220d between the body 210 and the first supporting portion 220a. The fourth supporting portion 220d is parallel to the first supporting portion 220a and connected to the lower portion 210a of the body 210. In addition, a thickness of the fourth supporting portion 220d is greater than a thickness of the first supporting portion 220a. The fourth supporting portion 220d further relieves a thermal stress due to the thermal expansion of the body 210. Therefore, the fourth supporting portion 220d functions as a relieving unit between the body 210 and the first supporting portion 220a for a thermal stress of the body 210.

Figure 9:
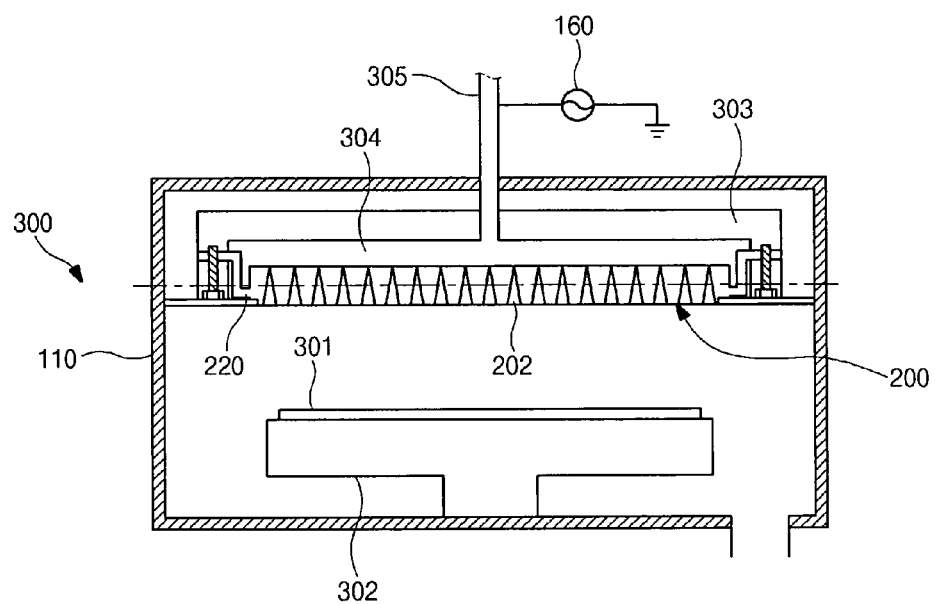
FIG. 9 is a schematic cross-sectional view showing a plasma apparatus for a semiconductor device or an LCD device according to an embodiment of the present invention.

FIG. 9 is a schematic cross-sectional view showing a plasma apparatus for a semiconductor device or an LCD device according to an embodiment of the present invention.

In FIG. 9, the plasma apparatus 300 includes a chamber 110 defining a reaction space, a susceptor 302 having a substrate 301 thereon and a gas distributor 340 over the susceptor 302. The gas distributor 200, which may be referred to as a shower head, includes a plurality of injection holes 202. A backing plate 303 is disposed over the gas distributor 200 and functions as a radio frequency (RF) electrode. Edge portions of the gas distributor 200 are fixed to the backing plate 303 to define a buffer space 304. The buffer space 304 is utilized for a uniform injection of reaction gases such that the reaction gases are supplied to the buffer space 304 through a gas injection pipe 305 from an exterior gas tank (not shown) and then are primarily diffused in the buffer space 304.

The gas injection pipe 305 may be connected to an RF power supply 160 because the gas injection pipe 305 generally penetrates through a center of the backing plate 303. When the RF power supply 160 is connected to the gas injection pipe 305, an RF power is applied to the center of the backing plate 303 and a symmetric plasma is obtained. The susceptor 302 is movable up-and-down by a driving means (not shown) and includes a heater (not shown) therein for heating the substrate 301. The susceptor 302 may be grounded and functions as an opposite electrode to the gas distributor 200 where the RF power is applied through the backing plate 303 from the RF power supply 160. An exhaust for removing residual gases is formed through a bottom of the chamber 110 and is connected to a vacuum pump such as a turbo molecular pump.

The gas distributor 200 is supported by a body supporting unit 220. When the gas distributor 200 is divided into a lower portion and an upper portion with respect to a mass center surface, the body supporting unit 220 extends from the lower portion of the gas distributor 200. In addition, the gas distributor 200 may have a rectangular shape or a circular shape, and include aluminum. The plurality of injection holes 202 may have a conic shape to diffuse the reaction gases. An upper portion of the conic shape has a diameter smaller than a lower portion of the conic shape. The body supporting unit 220 may be connected to the backing plate 303 using a fixing means such as bolt. For more stable fixation, a clamping bar may be interposed between the body supporting unit 220 and the fixing means. In addition, an edge portion of the gas distributor 200 and the clamping bar may be supported by a supporting means extending from a sidewall of the chamber 110. The supporting means includes an insulating material to prevent a leakage of the RF power.

In a plasma apparatus having a gas distributor according to an embodiment of the present invention, a thermal transformation of the gas distributor due to a high temperature plasma and/or a heat radiation from a heater is prevented. Therefore, a process uniformity is improved.

It will be apparent to those skilled in the art that various modifications and variations can be made in the apparatus having a gas distributor without departing from the spirit or scope of the invention. Thus, it is intended that the present invention covers the modifications and variations of this invention provided they come within the scope of the appended claims and their equivalents.

What is claimed is:

1. A gas distributor for a plasma apparatus, comprising:
a body having a plurality of injection holes, the body being divided into a lower portion and an upper portion with respect to a center portion;
a body supporting unit; and
a relieving unit connected to only the lower portion of the body and the body supporting unit for relieving a thermal stress of the body,
wherein the relieving unit has a thickness smaller than a thickness of the body and greater than a thickness of the body supporting unit.

2. The gas distributor unit according to claim 1, wherein the body and the body supporting unit constitute a monolithic shape.

3. The gas distributor according to claim 1, wherein the body and the body supporting unit include aluminum.

4. The gas distributor according to claim 1, wherein the relieving unit is connected to a sidewall of the lower portion and the body supporting unit.

5. The gas distributor according to claim 1, wherein the body supporting unit is perpendicularly connected to the relieving unit.

6. The gas distributor according to claim 1, wherein the body supporting unit includes a first supporting unit connected to the relieving unit and a second supporting unit perpendicularly connected to the first supporting unit.

7. The gas distributor according to claim 6, further comprising a third supporting portion perpendicularly connected to the second supporting portion and parallel to the first supporting portion.

8. The gas distributor according to claim 1, wherein the center portion includes a horizontal center portion.

9. The gas distributor according to claim 1, wherein the body has a plate shape.

10. The gas distributor according to claim 1, wherein the body supporting unit includes a first supporting portion, a second supporting portion and a third supporting portion and wherein the first supporting portion, the second supporting portion and the third supporting portion have the same thickness.

11. The gas distributor according to claim 1, wherein the relieving unit has the same thickness as the lower portion of the body.

12. The gas distributor according to claim 1, wherein the center portion is horizontally extended from the center of mass of the body, wherein the relieving unit is connected to the lower portion of the body below the center portion.

13. The gas distributor according to claim 1, wherein a material of the relieving unit extends contiguously from the lower portion of the body to the body supporting unit along a line parallel with a lower surface of the of the body.

14. A plasma apparatus, comprising:
a process chamber treating a substrate;
a susceptor having the substrate thereon; and
a gas distributor over the substrate, the gas distributor comprising:
a body having a plurality of injection holes, the body being divided into a lower portion and an upper portion with respect to a center portion;
a body supporting unit; and
a relieving unit connected to only the lower portion of the body and the body supporting unit for relieving a thermal stress of the body,
wherein the relieving unit has a thickness smaller than a thickness of the body and greater than a thickness of the body supporting unit.

* * * * *